(12) United States Patent
Tsai et al.

(10) Patent No.: US 12,376,234 B2
(45) Date of Patent: Jul. 29, 2025

(54) COMMUNICATION DEVICE

(71) Applicant: Innolux Corporation, Miaoli County (TW)

(72) Inventors: Tsung-Han Tsai, Miaoli County (TW);
Yu-Chia Huang, Miaoli County (TW);
Ying-Jen Chen, Miaoli County (TW);
Jen-Hai Chi, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 441 days.

(21) Appl. No.: 18/079,007

(22) Filed: Dec. 12, 2022

(65) Prior Publication Data

US 2023/0217595 A1   Jul. 6, 2023

Related U.S. Application Data

(60) Provisional application No. 63/296,492, filed on Jan. 5, 2022.

(30) Foreign Application Priority Data

Sep. 20, 2022   (CN) ......................... 202211145856.9

(51) Int. Cl.
*H05K 1/18*   (2006.01)

(52) U.S. Cl.
CPC ... *H05K 1/181* (2013.01); *H05K 2201/10166* (2013.01); *H05K 2201/10272* (2013.01)

(58) Field of Classification Search
CPC ......... H05K 1/181; H05K 2201/10166; H05K 2201/10272

USPC .......................................................... 361/760
See application file for complete search history.

(56) References Cited

U.S. PATENT DOCUMENTS

| | | | |
|---|---|---|---|
| 2016/0125844 A1 | 5/2016 | Lee | |
| 2018/0337445 A1 | 11/2018 | Sullivan et al. | |
| 2019/0213952 A1* | 7/2019 | Park | G09G 3/3233 |
| 2020/0251066 A1* | 8/2020 | Hu | G09G 3/3677 |

FOREIGN PATENT DOCUMENTS

| | | |
|---|---|---|
| CN | 108604734 | 9/2018 |
| TW | 201626065 | 7/2016 |

OTHER PUBLICATIONS

"Office Action of Taiwan Counterpart Application", issued on Jun. 14, 2023, p. 1-p. 6.
"Search Report of Europe Counterpart Application", issued on Jul. 27, 2023, p. 1-p. 12.

* cited by examiner

*Primary Examiner* — Andargie M Aychillhum
(74) *Attorney, Agent, or Firm* — JCIPRNET

(57) ABSTRACT

A communication device including a substrate, a gate drive circuit, and a first tunable unit is provided. The gate drive circuit is disposed on the substrate. The gate drive circuit includes a first thin-film transistor and is configured to output a gate drive signal. The first tunable unit is disposed on the substrate and is electrically connected to the gate drive circuit. The first tunable unit includes a first drive circuit and a first tunable component. The first drive circuit includes a first terminal and a second terminal, and the first terminal of the first drive circuit is configured to receive the gate drive signal. The first tunable component is electrically connected to the second terminal of the first drive circuit.

18 Claims, 15 Drawing Sheets

COMMUNICATION DEVICE

CROSS-REFERENCE TO RELATED APPLICATION

This application claims the priority benefit of U.S. provisional application Ser. No. 63/296,492, filed on Jan. 5, 2022 and China application serial no. 202211145856.9, filed on Sep. 20, 2022. The entirety of each of the above-mentioned patent applications is hereby incorporated by reference herein and made a part of this specification.

BACKGROUND

Technical Field

The disclosure relates to a communication device.

Description of Related Art

At present, the drive circuits used in communication devices are all provided in the form of driver chips. Therefore, it is one of the current goals to develop a technology to allow a drive circuit to be directly disposed on the substrate of a communication device.

SUMMARY

The disclosure provides a communication device in which a drive circuit is disposed on the substrate.

According to an embodiment of the disclosure, a communication device includes a substrate, a gate drive circuit, and a first tunable unit. The gate drive circuit is disposed on the substrate. The gate drive circuit includes a first thin-film transistor and is configured to output a gate drive signal. The first tunable unit is disposed on the substrate and is electrically connected to the gate drive circuit. The first tunable unit includes a first drive circuit and a first tunable component. The first drive circuit includes a first terminal and a second terminal, and the first terminal of the first drive circuit is configured to receive the gate drive signal. The first tunable component is electrically connected to the second terminal of the first drive circuit.

According to an embodiment of the disclosure, a communication device includes a first substrate, a second substrate, a gate drive circuit, and a first tunable unit. The substrate includes an operation area and a peripheral area. The second substrate is disposed on the operation area. The gate drive circuit is disposed on the second substrate. The first tunable unit is disposed on the first substrate and is electrically connected to the gate drive circuit. The first tunable unit includes a first drive circuit and a first tunable component, and the first tunable component is electrically connected to the first drive circuit.

According to an embodiment of the disclosure, a communication device includes a first substrate, a second substrate, a gate drive circuit, and a first tunable unit. The second substrate is disposed on the first substrate. The gate drive circuit is disposed on the first substrate or on the second substrate. The gate drive circuit includes a first thin-film transistor and is configured to output a gate drive signal. The first tunable unit is disposed on the second substrate and is electrically connected to the gate drive circuit. The first tunable unit includes a first drive circuit and a first tunable component. The first drive circuit includes a first terminal and a second terminal, and the first terminal of the first drive circuit is configured to receive the gate drive signal. The first tunable component is electrically connected to the second terminal of the first drive circuit.

In order to make the aforementioned and other features and advantages of the disclosure more comprehensible, several embodiments accompanied with figures are described in detail below.

BRIEF DESCRIPTION OF THE DRAWINGS

The accompanying drawings are included to provide a further understanding of the disclosure, and the accompanying drawings are incorporated in and constitute a part of this specification. The drawings illustrate the embodiments of the disclosure, and together with the description, serve to explain the principle of the disclosure.

DESCRIPTION OF THE EMBODIMENTS

Figure 1:
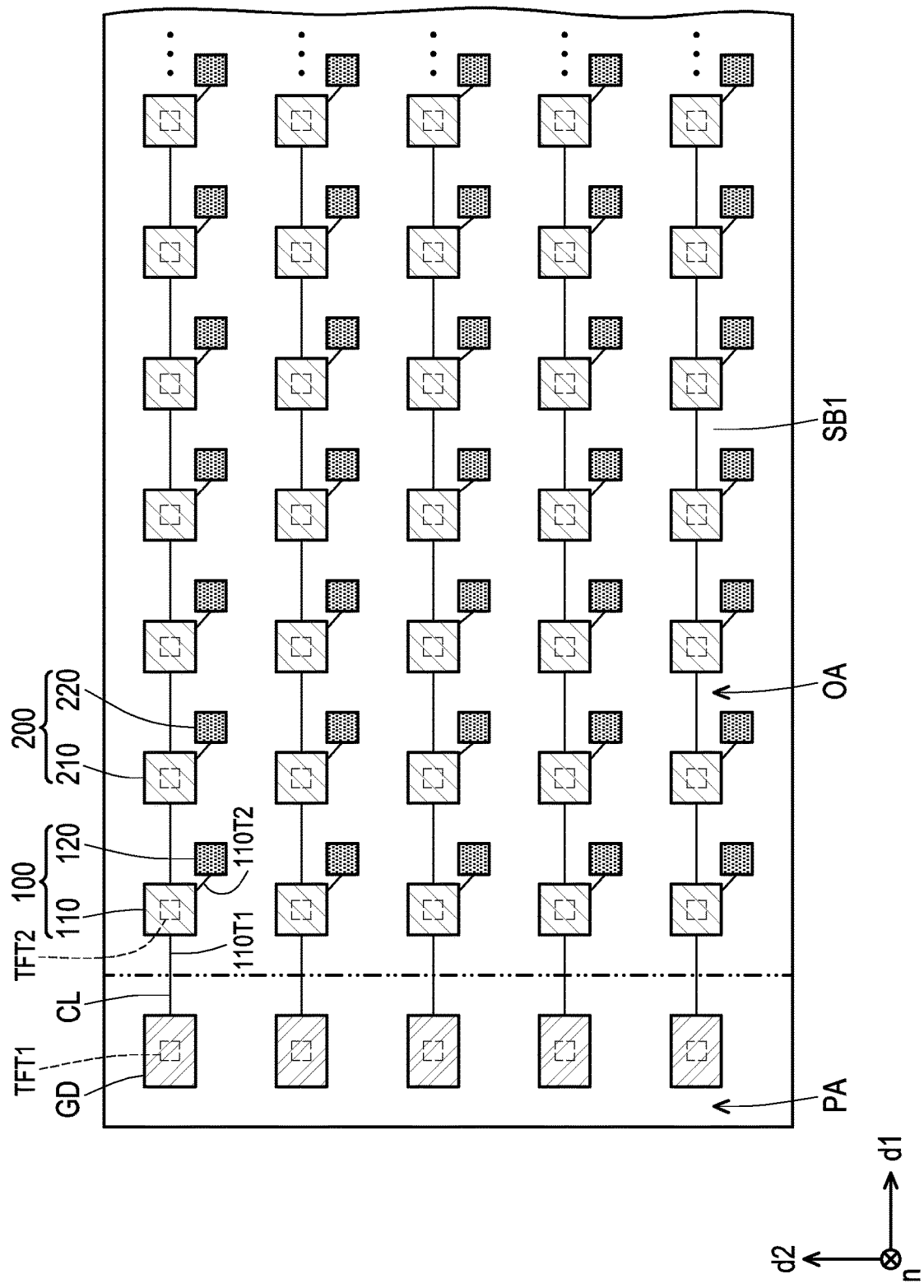
FIG. 1 is a schematic top view of a communication device according to the first embodiment of the disclosure.

The disclosure may be understood by referring to the following detailed description with reference to the accompanying drawings. It is noted that for comprehension of the reader and simplicity of the drawings, in the drawings provided in the disclosure, only a pail of the communication device is shown, and certain devices in the drawings are not necessarily drawn to actual scale. Moreover, the quantity and the size of each device in the drawings are only schematic and exemplary and are not intended to limit the scope of protection provided in the disclosure.

Throughout the specification and appended claims of the disclosure, certain terms are used to refer to specific components. People skilled in the art should understand that manufacturers of communication devices may refer to same elements under different names. The disclosure does not intend to distinguish devices with the same functions but different names. In the following specification and claims, the words "including", "containing", and "having" are open-ended words and therefore should be interpreted as "containing but not limited to . . . ". Therefore, when the terms "including," "containing," and/or "having" are used in the description of the disclosure, the terminologies designate the presence of a corresponding feature, region, step, operation, and/or element, but do not exclude the presence of one or more corresponding features, regions, steps, operations, and/or elements.

Directional terminologies mentioned herein, such as "top", "bottom", "front", "back", "left", "right", and so forth, refer to directions in the accompanying reference drawings. Accordingly, the directional terminologies provided herein serve to describe rather than limiting the disclosure. In the accompanying drawings, each figure illustrates methods applied in particular embodiments and general features of structures and/or materials in the embodiments. However, these figures should not be construed or defined as the scope covered by the particular embodiments. For instance, relative dimensions, thicknesses, and positions of various layers, regions, and/or structures may be reduced or enlarged for clarity.

When a corresponding element (such as a film layer or a region) is referred to as being on "another element", the element may be directly on the other element or there may be another element between the two. On the other hand, when an element is referred to as being "directly on another element", there is no element between the two. Also, when an element is referred to as being "on another element", the two have a top-down relationship in the top view direction, and the element may be above or below the other element, and the top-down relationship depends on the orientation of the device.

The terminologies "about", "equal to", "equivalent to" or "same", "substantially" or "approximately" are generally interpreted as being within 10% of a given value or range, or interpreted as being within 5%, 3%, 2%, 1%, or 0.5% of a given value or range.

The ordinal numbers used in the specification and claims, such as "first", "second", etc., are used to modify the elements, and they do not imply or represent the (or these) elements have any previous ordinal numbers, do not represent the order of an element and another element, or the order of a manufacturing method. The use of these ordinal numbers is only used to clearly distinguish an element with a certain name from another element with the same name. The terms used in the claims and the specification may not have to be the same, and accordingly, the first component provided in the specification may be the second component in the claims.

It should be understood that the following embodiments may replace, reorganize, and mix the features in several different embodiments to complete other embodiments without departing from the spirit of the disclosure. As long as the features of the embodiments do not violate the spirit of the disclosure or conflict each other, they may be mixed and matched as desired.

An electrical connection or coupling relationship described in this disclosure may refer to a direct connection or an indirect connection. In the case of the direct connection, end points of the elements on two circuits are directly connected or connected to each other by a conductor segment, and in the case of the indirect connection, there are switches, diodes, capacitors, inductors, resistors, other appropriate elements, or a combination of the above elements between the end points of the elements on the two circuits, which should not be construed as a limitation in the disclosure.

In this disclosure, measurement of thickness, length, and width may be done by applying an optical microscope, and the thickness or the width may be obtained by measuring a cross-sectional image in an electron microscope, which should not be construed as a limitation in the disclosure. In addition, certain errors between any two values or directions for comparison may be acceptable. If a first value is equal to a second value, it implies that there may be an error of about 10% between the first value and the second value. If a first direction is perpendicular to a second direction, an angle difference between the first direction and the second direction may be between 80 degrees and 100 degrees; if the first direction is parallel to the second direction, an angle difference between the first direction and the second direction may be between 0 degrees and 10 degrees.

The communication device of the disclosure may include but not limited to displaying, communication, lighting, sensing, touch, splicing, and other suitable functions, or a combination of the above functions. The communication device can achieve the communication function through, for example, an antenna (e.g., a liquid crystal antenna), a wireless router (Wifi router), a reconfigurable intelligent surface (RIS) device, metalens, or a suitable combination of the above, but not limited thereto. The communication device includes but not limited a bendable or flexible communication device. The communication device may include, for example, liquid crystal, a light emitting diode (LED), a quantum dot (QD), fluorescence, phosphor, other suitable materials, or a combination thereof. The LED may include but not limited to, for example, an organic LED (OLED), a micro LED or mini LED, or a quantum dot LED (QLED or QDLED).

Reference will now be made in detail to the exemplary embodiments of the disclosure, and the same reference numbers are used in the drawings and descriptions to indicate the same or similar parts.

Figure 2A:
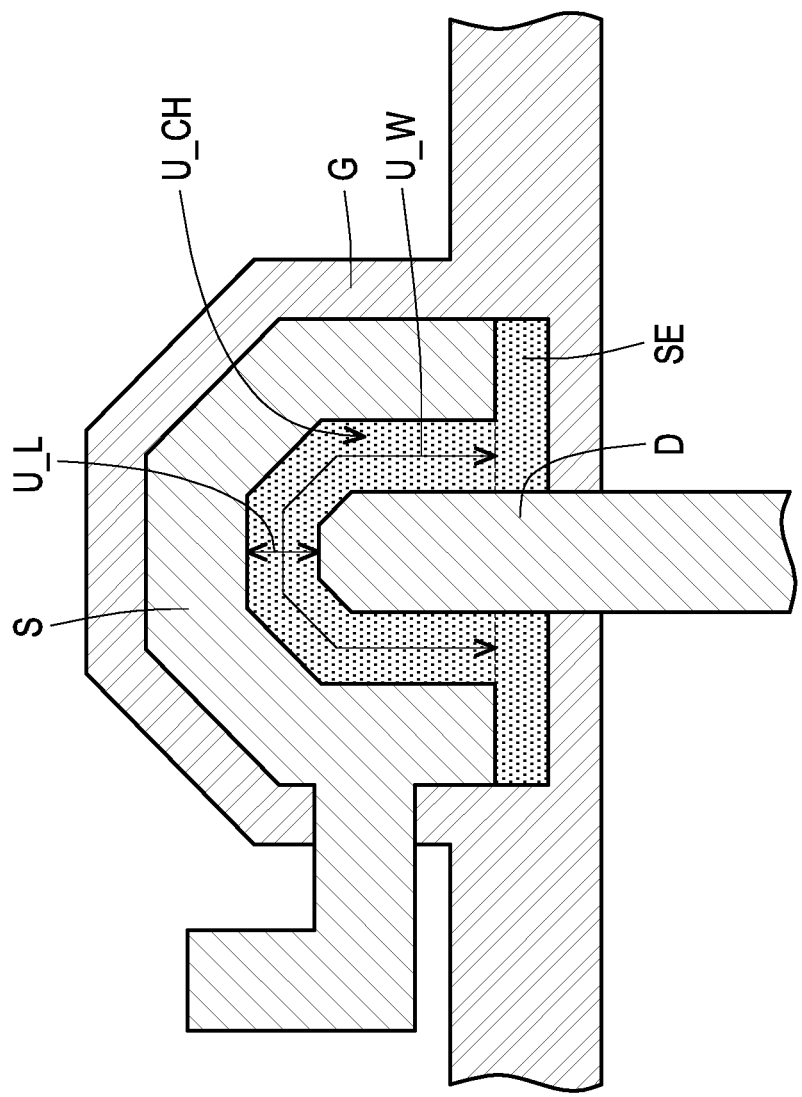
FIG. 2A is a schematic local top view of a U-type thin-film transistor according to an embodiment of the disclosure.
Figure 2B:
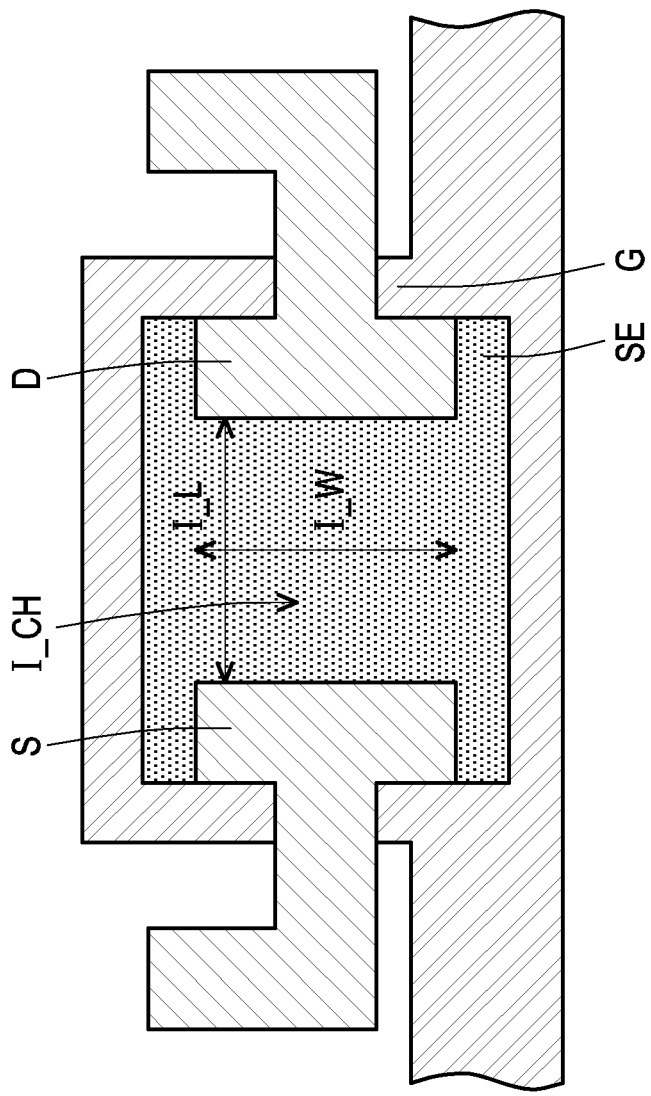
FIG. 2B is a schematic local top view of an I-type thin-film transistor according to an embodiment of the disclosure.

FIG. 1 is a schematic top view of a communication device according to the first embodiment of the disclosure, FIG. 2A is a schematic local top view of a U-type thin-film transistor according to an embodiment of the disclosure, and FIG. 2B is a schematic local top view of an I-type thin-film transistor according to an embodiment of the disclosure.

With reference to FIG. 1, a communication device 10a provided by this embodiment includes a substrate SB1, a gate drive circuit GD, and a first tunable unit 100.

The material of the substrate SB1 may be, for example, glass, plastic, or a combination thereof. For instance, the material of the substrate SB1 may include quartz, sapphire, poly ethyl methacrylate (PMMA), polycarbonate (PC), polyimide (PI), polyethylene terephthalate (PET), polyimide, ABF, PCB, other suitable materials, or a combination of the foregoing materials, which should not be construed as a limitation in the disclosure. In this embodiment, the substrate SB1 includes an operation area OA and a peripheral area PA, and the peripheral area PA is located on one side of the operation area OA. To be specific, the peripheral area PA of the substrate SB1 in the present embodiment is adjacent to the operation area OA in a first direction d1, but the disclosure is not limited thereto. In other embodiments, the peripheral area PA may be located on at least one side of the operation area OA. For instance, the peripheral area PA may be disposed on four sides of the operation area OA to surround the operation area OA. In some embodiments, the substrate SB1 may have only the operation area OA, for example, but the disclosure is not limited thereto.

The gate drive circuit GD is disposed on the substrate SB1, for example. In this embodiment, the gate drive circuit GD is provided in the peripheral area PA of the substrate SB1, and therefore, the gate drive circuit GD is provided on the substrate SB1 by providing the drive circuit on the substrate (gate driver on panel, GOP). In some embodiments, a plurality of gate drive circuits GD are provided, and the plurality of gate drive circuits GD are arranged in a second direction d2. The second direction d2 is orthogonal to the first direction d1, but the disclosure is not limited thereto. The gate drive circuit GD is configured to output a gate drive signal, for example. For instance, the gate drive circuit GD may include a plurality of shift buffer units (not shown) and a plurality of frequency signal lines (not shown), Each shift buffer unit includes, for example, a plurality of shift registers (not shown) connected in series with each other, and each shift register is electrically connected to a corresponding frequency signal line. Therefore, each shift register can receive the frequency signal from the corresponding frequency signal line and output the corresponding gate drive signal through the frequency signal. In some embodiments, the shift register may include a pull-up circuit (not shown) and a pull-down circuit (not shown), but the disclosure is not limited thereto.

With reference to FIG. 1, FIG. 2A, and FIG. 2B together, in some embodiments, the gate drive circuit GD includes a thin-film transistor TFT1. The thin-film transistor TFT1 included in the gate drive circuit GD may be, for example, a U-type transistor or an I-type thin-film transistor. The U-type thin-film transistor has a U-shaped channel U_CH in a normal direction n (top view direction) of the substrate, and the 1-type thin-film transistor has an 1-type channel I_CH in the normal direction n of the substrate. The normal direction n of the substrate is orthogonal to the first direction d1 and the second direction d2. The thin-film transistor has, for example, a gate, a source, a drain, and a semiconductor layer. Taking a U-shaped thin-film transistor as an example herein, the U-shaped thin-film transistor may include a gate G, a source S, a drain D, and a semiconductor layer SE. The gate G is provided, for example, corresponding to the semiconductor layer SE, that is, the gate G overlaps, for example, at least partially with the semiconductor layer SE in the normal direction n of the substrate SB1. The source S and the drain D are separated from each other, for example, cover at least part of the semiconductor layer SE, are electrically connected to the semiconductor layer SE, and define the U-shaped channel U_CH. In some embodiments, the material of the semiconductor layer SE may include low temperature polysilicon (LTPS), metal oxide, amorphous silicon (a-Si), or a combination of the foregoing, but the disclosure is not limited thereto. For instance, the material of the semiconductor layer SE may include but not limited to amorphous silicon, polycrystalline silicon, germanium; a compound semiconductor (e.g., gallium nitride, silicon carbide, gallium arsenide, gallium phosphide, indium phosphide, indium arsenide, and/or indium antimonide), an alloy semiconductor (e.g., a SiGe alloy, GaAsP alloy, AlInAs alloy, AlGaAs alloy, GaInAs alloy, GaInP alloy, and GaInAsP alloy), or a combination of the foregoing. The material of the semiconductor layer SE may also include but not limited to metal oxide such as indium gallium zinc oxide (IGZO), indium zinc oxide (IZO), indium zinc oxide (IGZTO), or organic semiconductor containing polycyclic aromatic compounds, or a combination of the foregoing. The U-shaped thin-film transistor may be, for example, any bottom gate-type thin-film transistor known to a person having ordinary skill in the art. However, although the bottom gate-type thin-film transistor is used as an example in this embodiment, the disclosure is not limited thereto. It should be noted that the components and materials of the I-type thin-film transistor may be the same as or similar to the components and materials of the U-type thin-film transistor, and description thereof is not repeated herein. In addition, in some embodiments, the gate drive circuit GD may include a plurality of thin-film transistors TFT1, and the semiconductor layer of each thin-film transistor TFT1 may include the same material or different materials. For instance, the gate drive circuit GD may include two thin-film transistors TFT1, and each semiconductor layer of each of the thin-film transistors TFT1 includes metal oxide or low temperature polysilicon, but the disclosure is not limited thereto.

In some embodiments, the U-shaped channel U_CH of the U-shaped thin-film transistor has a channel length U_L and a channel width U_W. The definition of the channel length U_L of the U-shaped channel U_CH may be, for example, the distance from the source S to the drain D. The definition of the channel width U_W of the U-shaped channel U_CH may be, for example, the area of the U-shaped channel U_CH in the normal direction n of the substrate divided by the channel length U_L or the path of the U-shaped line connecting all the intermediate points between the source S and the drain D, for example. In addition, in some embodiments, the I-type channel I_CH of the I-type thin-film transistor has a channel length I_L and a channel width I_W. The definition of the channel length I_L of the I-type channel I_CH may also be, for example, the distance from the source S to the drain D. The definition of the channel width I_W of the I-type channel I_CH may also be, for example, the area of the I-type channel I_CH in the normal direction n of the substrate divided by the channel length I_L or the path of the straight line connecting all the intermediate points between the source S and the drain D, for example.

The first tunable unit 100 is disposed on the substrate SB1, for example, and is disposed in the operation area OA of the substrate SB1. Besides, the first tunable unit 100 is electrically connected to the gate drive circuit GD, for example. To be specific, in this embodiment., the first tunable unit 110 is electrically connected to the gate drive circuit GD through a signal line CL (e.g., gate line), but the disclosure is not limited thereto. In this embodiment, the first tunable unit 100 in each row corresponds to one gate drive circuit GD, but the disclosure is not limited thereto. In some embodiments, the first tunable unit 100 includes a first drive circuit 110 and a first tunable component 120. The first drive circuit 110 includes, for example, a first terminal 110T1 and a second terminal 110T2. The first terminal 110T1 of the first drive circuit 110 is configured to receive the gate drive signal, and the second terminal 110T2 of the first drive circuit 110 is electrically connected to the first tunable component 120. To be specific, the first terminal 110T1 of the first drive circuit 110 is, for example, coupled to the gate drive circuit GD to receive the gate drive signal from the gate drive circuit GD, and the second terminal 110T2 of the first drive circuit 110 is, for example, coupled to the first tunable component 120 to provide the gate drive signal from the gate drive circuit GD to the first tunable component 120.

With reference to FIG. 1, in some embodiments, the first drive circuit 110 further includes a thin-film transistor TFT2. The thin-film transistor TFT2 included in the first drive circuit 110 may be, for example, the U-type thin-film transistor or the I-type thin-film transistor of the foregoing embodiments. For the measurement method or definition of the channel length and the channel width of the thin-film transistor TFT2, reference may be made to the foregoing embodiments, so details are not described herein. In this embodiment, when the thin-film transistor TFT2 and the thin-film transistor TFT1 are both U-shaped thin-film transistors, the channel lengths and channel widths of the thin-film transistor TFT2 and the thin-film transistor TFT1 satisfy the following relationship: U_W2/U_L2<U_W1/U_L1, where U_L2 is the channel length of the thin-film transistor TFT2, U_W2 is the channel width of the thin-film transistor TFT2, U_L1 is the channel length of the thin-film transistor TFT1, and U_W1 is the channel width of the thin-film transistor TFT1. Further, in this embodiment, when the thin-film transistor TFT2 and the thin-film transistor TFT1 are both I-shaped thin-film transistors, the channel lengths and channel widths of the thin-film transistor TFT2 and the thin-film transistor TFT1 satisfy the following relationship: I_W2/I_L2<I_W1/I_L1, where I_L2 is the channel length of the thin-film transistor TFT2, I_W2 is the channel width of the thin-film transistor TFT2, I_L1 is the channel length of the thin-film transistor TFT1, and I_W1 is the channel width of the thin-film transistor TFT1. To be specific, the ratio of the channel width to the channel length of the thin-film transistor TFT2 included in the first drive circuit 110 is less than the ratio of the channel width to the channel length of the thin-film transistor TFT1 included in the gate drive circuit GD. That is, the equivalent resistance of the thin-film transistor TFT2 included in the first drive circuit 110 is less than the equivalent resistance of the thin-film transistor TFT1 included in the gate drive circuit GD. It should be noted that the thin-film transistor TFT1 and the thin-film transistor TFT2 may be different thin-film transistors, which can be taken as an example of the equivalent resistance of the thin-film transistor to be designed. When the thin-film transistor TFT1 and the thin-film transistor TFT2 are different thin-film transistors, they also satisfy the aforementioned ratio relationship between the channel width and the channel length. In addition, the first drive circuit 110 may further include passive components or other suitable electronic components, which are not limited in the disclosure.

In some embodiments, the thin-film transistor TFT2 in the first drive circuit 110 and the thin-film transistor TFT1 in the gate drive circuit GD may have different materials or different lattice structures. For instance, the material included in the semiconductor layer of the thin-film transistor TFT2 in the first drive circuit 110 may be, for example, amorphous silicon, and the material included in the semiconductor layer of the thin-film transistor TFT1 in the gate drive circuit GD may be, for example, low temperature polysilicon, but the disclosure is not limited thereto. In addition, in some embodiments, the first drive circuit 110 may include a plurality of thin-film transistors TFT2, where the semiconductor layer of each thin-film transistor TFT2 may include the same material or different materials. For instance, the first drive circuit 110 may include two thin-film transistors TFT2, and their respective semiconductor layers include amorphous silicon or low temperature polysilicon, but the disclosure is not limited thereto.

The first tunable component 120 may be applicable to, for example, the communication field, the radar/lidar field, the reconfigurable intelligent surface (RIS) technology, metal-ens, or other suitable fields/technologies, and the disclosure is not limited thereto. In some embodiments, the first tunable component 120 may include a variable capacitor, a variable resistor, a varactor diode, a phase shifter, an amplifier, an antenna, a biometric sensor, a graphene sensor, other suitable tunable components, or a combination thereof. In addition, the first tunable unit 100 may be a radio frequency unit, the first tunable component 120 may be a radio frequency, component and the frequency of the first tunable component 120 may be adjusted in a range of approximately 3 MHz to 300 THz, but the disclosure is not limited thereto.

In some embodiments, the communication device 10a further includes a second tunable unit 200. The second tunable unit 200 is disposed on the substrate SB1 as well, for example, and is disposed in the operation area OA of the substrate SB1. The first tunable unit 100 is closer to the gate drive circuit GD than the second tunable unit 200. The second tunable unit 200 may be arranged on the substrate SB1 together with the first tunable unit 100 in an array arrangement manner, an alternating arrangement manner (e.g., a pentile manner), or other manners, for example, which is not limited in the disclosure. In this embodiment, the second tunable unit 200 and the first tunable unit 100 are disposed on the substrate SB1 in an array arrangement manner. The second tunable unit 200 is coupled to the first tunable unit 100 in the first direction d1, for example, so that the second tunable unit 200 may be electrically connected to the gate drive circuit GD through the first tunable unit 100, but the disclosure is not limited thereto. The second tunable unit 200 includes a second drive circuit 210 and a second tunable component 220, for example. The second drive circuit 210 and the second tunable component 220 in this embodiment may be the same as or similar to the first drive circuit 110 and the first tunable component 120 described above, respectively, so description thereof is not repeated herein. It should be noted that in other embodiments, the second drive circuit 210 may be different from the first drive circuit 110, and description thereof is to be provided in the following embodiments.

Figure 3:
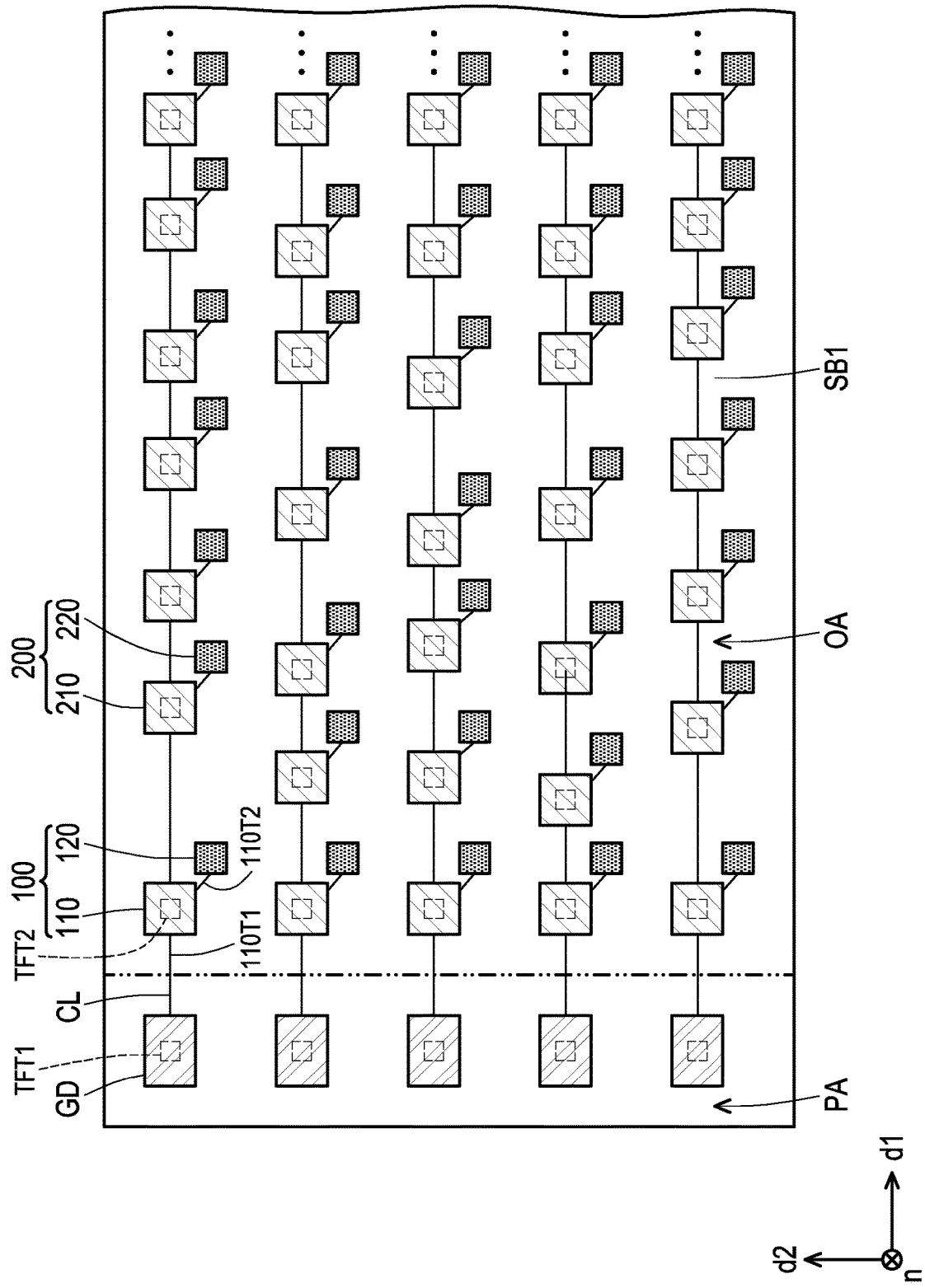
FIG. 3 is a schematic top view of a communication device according to the second embodiment of the disclosure.

FIG. 3 is a schematic top view of a communication device according to the second embodiment of the disclosure. It should be mentioned that the reference numbers and some content provided in the embodiment shown in FIG. 1 may be applied in the embodiment shown in FIG. 3, where the same or similar reference numbers serve to denote the same or similar elements, and the description of the same technical content is omitted.

With reference to FIG. 3, the main difference between a communication device 10b of this embodiment and the communication device 10a shown in FIG. 1 is that: the first tunable unit 100 and the second tunable unit 200 of the communication device lob are not arranged on the substrate 100 in an array arrangement manner. To be specific, the number of tunable units (first tunable unit 100 and the second tunable unit 200) for each row or the number of tunable units (first tunable unit 100 and the second tunable unit 200) connected to each signal line CL may be different or the same. It should be noted that a row of tunable units defined herein does not limit the tunable units to extend in the same direction. In other embodiments, a row of tunable units may extend along a curved, arc, or other non-linear trajectory, or tunable units in different rows may share the same signal line CL. Further, the relationship between the numbers of tunable units in the rows satisfies the following relation: $|(N_a - N_{a+1})/(N_a)| < 10\%$, where $N_a$ is the number of tunable units in row a, $N_{a+1}$ is the number of tunable units in row a+1, and a is a natural number.

Figure 4:
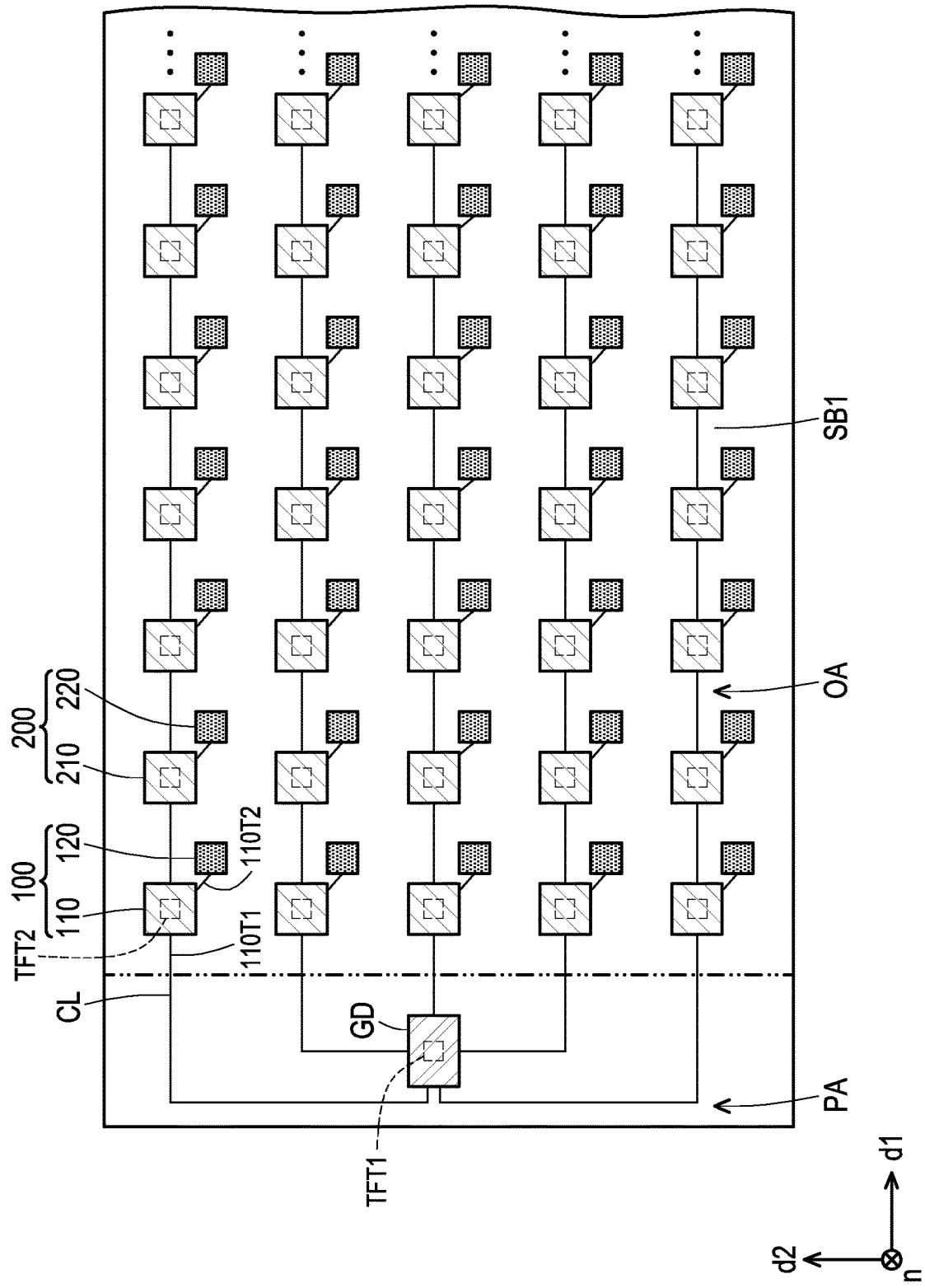
FIG. 4 is a schematic top view of a communication device according to the third embodiment of the disclosure.

FIG. 4 is a schematic top view of a communication device according to the third embodiment of the disclosure. It should be mentioned that the reference numbers and some content provided in the embodiment shown in FIG. 1 may be applied in the embodiment shown in FIG. 4, where the same or similar reference numbers serve to denote the same or similar elements, and the description of the same technical content is omitted.

With reference to FIG. 4 the main difference between a communication device 10c of this embodiment and the communication device 10a shown in FIG. 1 is that: one gate drive circuit GD of the communication device 10c corresponds to a plurality of rows of the first tunable units 100. To be specific, the gate drive circuit GD of the communication device 10c may include a plurality of signal output terminals, and each signal output terminal is coupled to the first terminal 110T1 of the first drive circuit 110 in the first tunable unit 100 of the corresponding row. It should be noted that although FIG. 4 shows that the communication device 10c includes only one gate drive circuit GD, a person having ordinary skill in the art knows that the communication device 10c includes a plurality of gate drive circuits GD.

Figure 5:
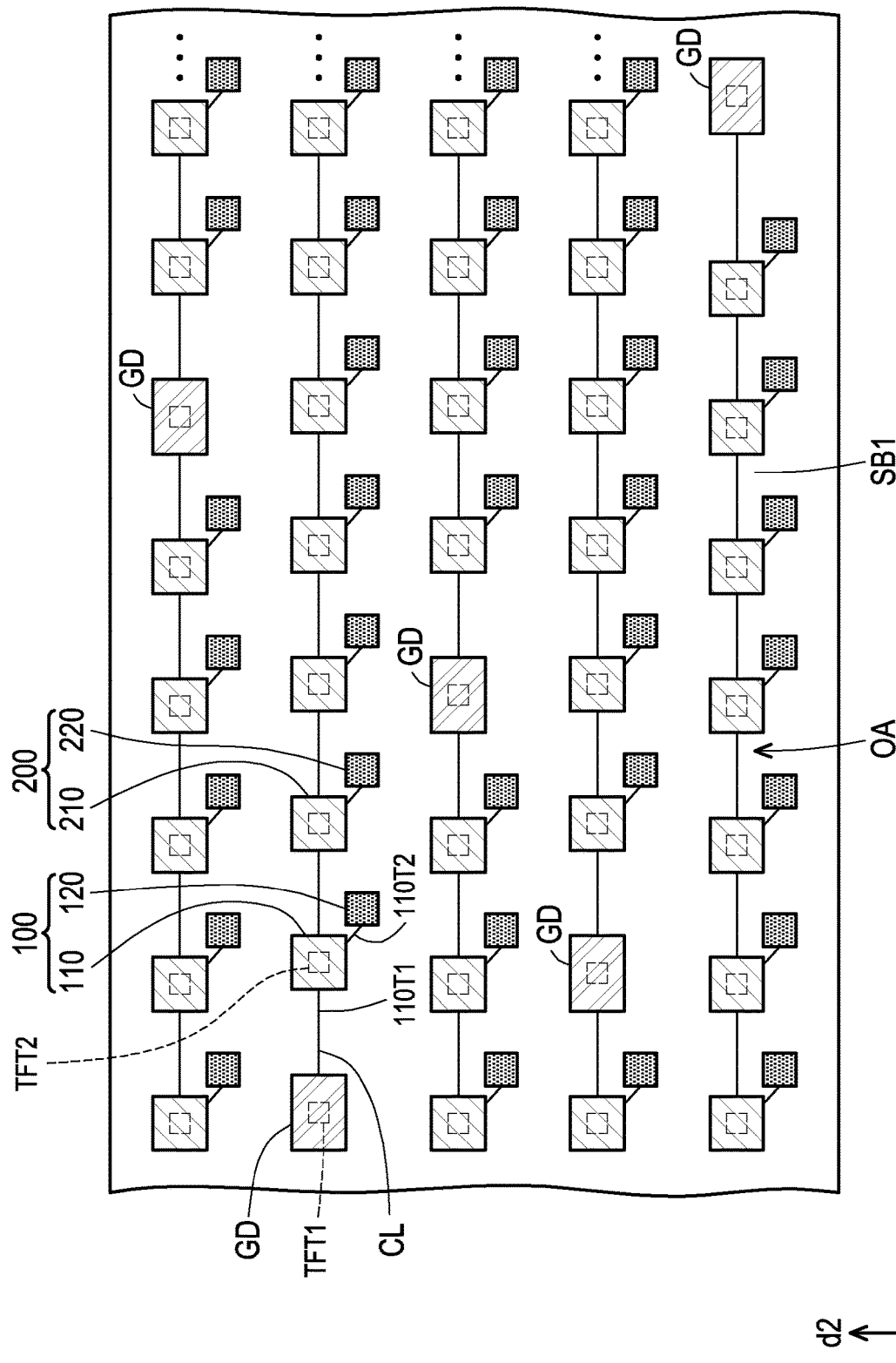
FIG. 5 is a schematic top view of a communication device according to the fourth embodiment of the disclosure.

FIG. 5 is a schematic top view of a communication device according to the fourth embodiment of the disclosure. It should be mentioned that the reference numbers and some content provided in the embodiment shown in FIG. 1 may be applied in the embodiment shown in FIG. 5, where the same or similar reference numbers serve to denote the same or similar elements, and the description of the same technical content is omitted.

With reference to FIG. 5, the main difference between a communication device 10d of this embodiment and the communication device 10a shown in FIG. 1 is that: the gate drive circuit GD of the communication device 10d is disposed in the operation area. OA of the substrate 100. To be specific, the gate drive circuit GD may be disposed on the substrate SB1 together with the first tunable unit 100 in an array arrangement manner in the operation area OA. Based on the above, the area of the peripheral area. PA of the communication device 10d in this embodiment may be reduced.

Figure 6:
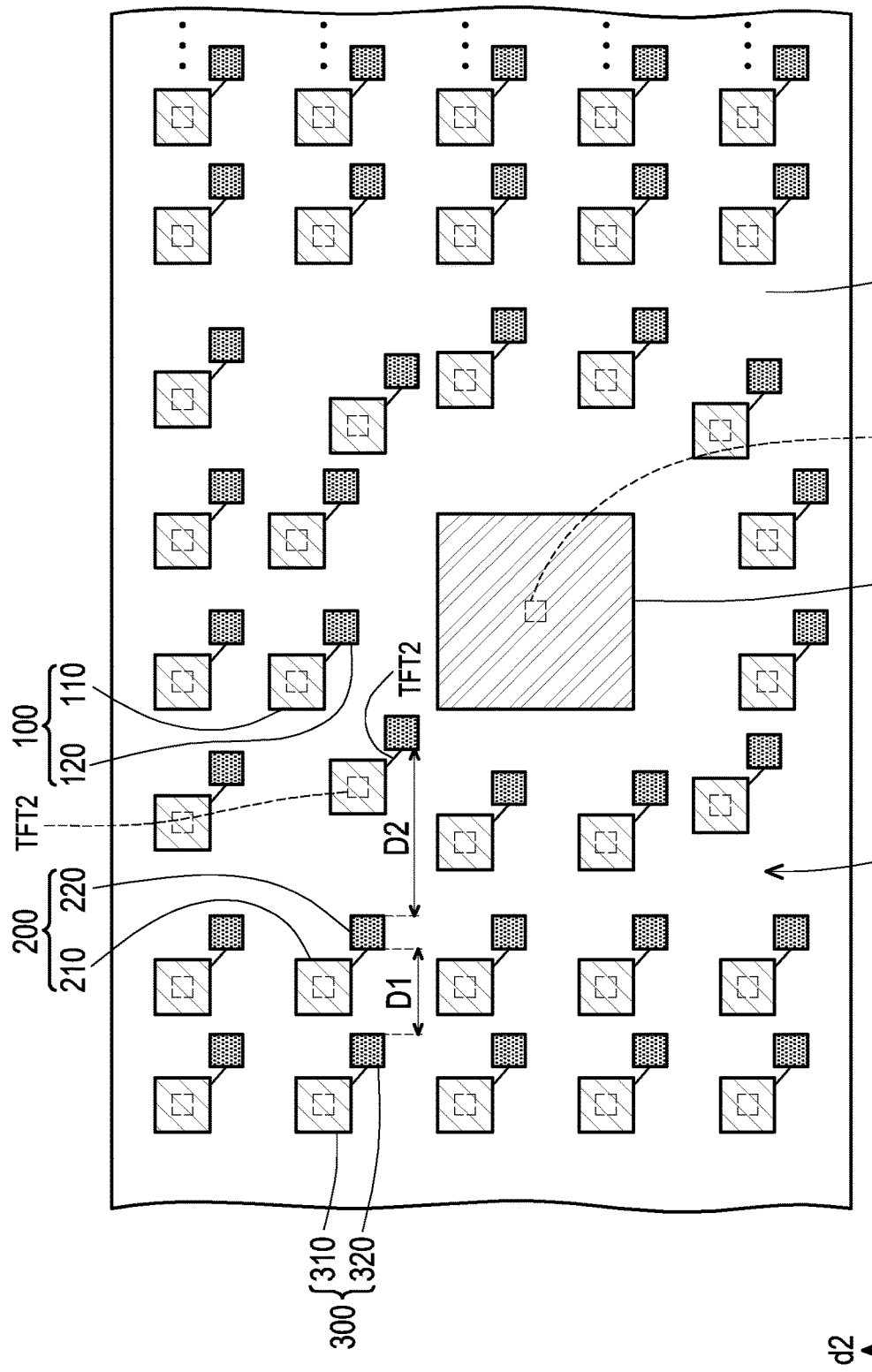
FIG. 6 is a schematic top view of a communication device according to the fifth embodiment of the disclosure.

FIG. 6 is a schematic top view of a communication device according to the fifth embodiment of the disclosure. It should be mentioned that the reference numbers and some content provided in the embodiment shown in FIG. 5 may be applied in the embodiment shown in FIG. 6, where the same or similar reference numbers serve to denote the same or similar elements, and the description of the same technical content is omitted.

With reference to FIG. 6, the main difference between a communication device 10e of this embodiment and the communication device 10d shown in FIG. 5 is that: the gate drive circuit GD is not disposed on the substrate SB1 together with the first tunable unit 100 in an array arrangement manner in the operation area OA, which enables the adjacent tunable units adjacent to the gate drive circuit GD to be provided different distances. To be specific, in this embodiment, the communication device 10e further includes a third tunable unit 300, where the second tunable unit 200 is located between the first tunable unit 100 and the third tunable unit 300. In some embodiments, the third tunable unit 300 is electrically connected to the gate drive circuit GD. To be specific, the third tunable unit 300 is coupled to the second tunable unit 200, so that the third tunable unit 300 may be electrically connected to the gate drive circuit GD through the first tunable unit 100. The third tunable unit 300 includes a third drive circuit 310 and a third tunable component 320, for example. The third drive circuit 310 and the third tunable component 320 may be the same as or similar to the second drive circuit 210 and the second tunable component 220 described in the foregoing embodiment, respectively, but the disclosure is not limited thereto. In this embodiment, a distance D1 between the second tunable component 220 and the third tunable component 320 is less than a distance D2 between the first tunable component 120 and the second tunable component 220. From another perspective, compared to the foregoing embodiments, the first tunable component 120 is closer to the gate drive circuit GD. For instance, the first tunable components 120 may be arranged in a ring shape and surround the gate drive circuit GD, but the disclosure is not limited thereto. Through the aforementioned design, the defects caused by the gate drive circuit GD disposed in the operation area may be compensated, and the yield of the communication device 10e may thus be improved.

Figure 7:
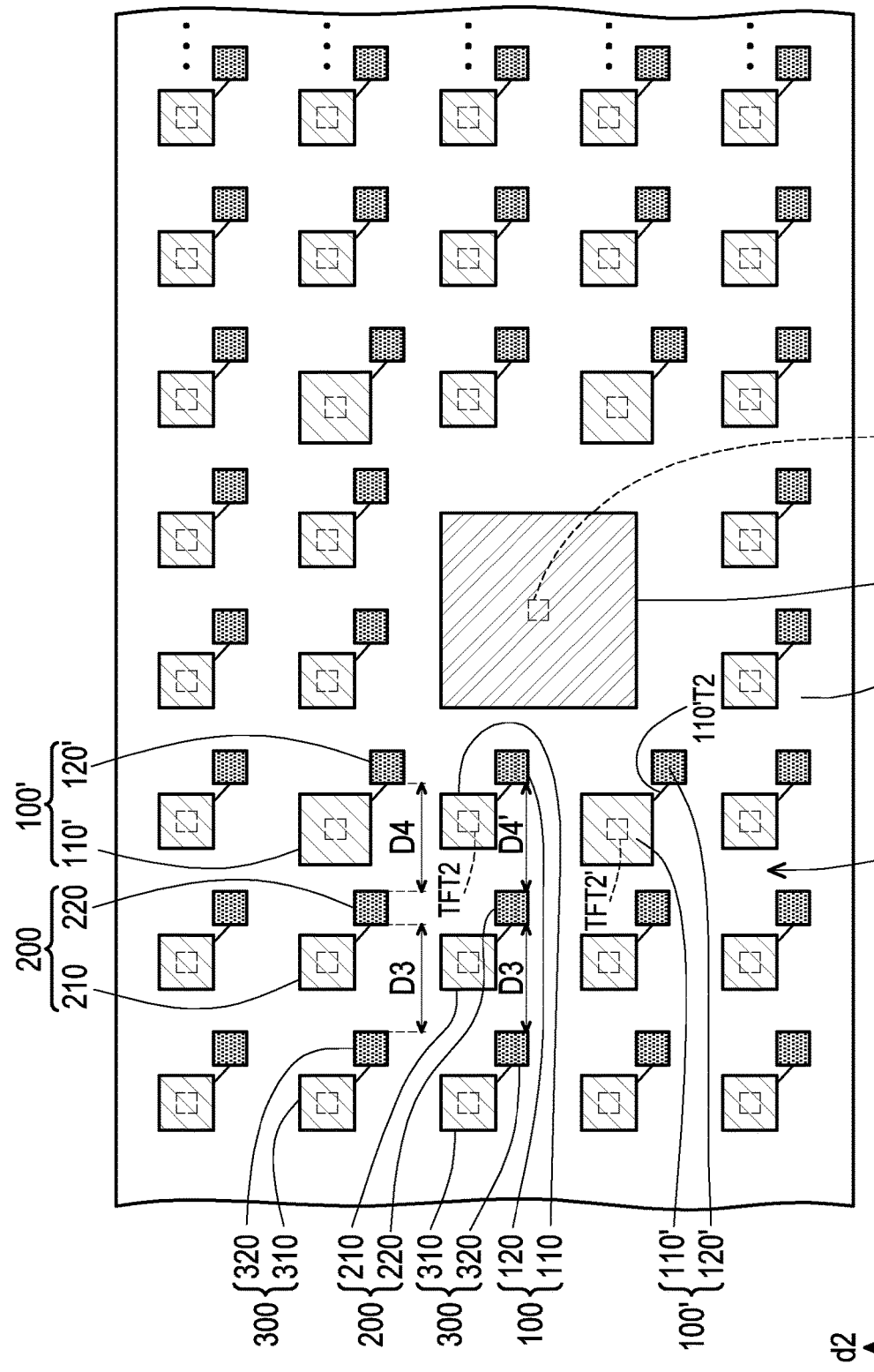
FIG. 7 is a schematic top view of a communication device according to the sixth embodiment of the disclosure.

FIG. 7 is a schematic top view of a communication device according to the sixth embodiment of the disclosure. It should be mentioned that the reference numbers and some content provided in the embodiment shown in FIG. 6 may be applied in the embodiment shown in FIG. 7, where the same or similar reference numbers serve to denote the same or similar elements, and the description of the same technical content is omitted.

With reference to FIG. 7, the main difference between a communication device 10f of this embodiment and the communication device 10e shown in FIG. 6 is that: the communication device 10f includes a first tunable unit 100', and compared to the thin-film transistor TFT2 of the first tunable unit 100 (first drive circuit 110), a thin-film transistor TFT2' in the first tunable unit 100' (first drive circuit 110') has a different size or has a different material or a different lattice structure. To be specific, the ratio of the channel width to the channel length of the thin-film transistor TFT2' in the first drive circuit 110' may be different from the ratio of the channel width to the channel length of the thin-film transistor TFT2 in the first drive circuit 110. In this embodiment, the ratio of the channel width to the channel length of the thin-film transistor TFT2' in the first drive circuit 110' may be greater than the ratio of the channel width to the channel length of the thin-film transistor TFT2 in the first drive circuit 110. For instance, the channel size of the thin-film transistor TFT2' in the first drive circuit 110' may be similar to channel size of the thin-film transistor TFT' in the gate drive circuit GD, but the disclosure is not limited thereto. Alternatively, the material included in the thin-film transistor TFT2' in the first drive circuit 110' may be, for example, a metal oxide, and the material included in the thin-film transistor TFT2 in the first drive circuit 110 may be, for example, low temperature polysilicon. In this embodiment, the first tunable unit 100' is disposed close to four corners of the gate drive circuit GD, Through the aforementioned design, the thin-film transistor TFT2' in the first drive circuit 110' has relatively strong power and relatively good leakage performance, which can compensate for the defects caused by the gate drive circuit GD disposed in the operation area, and the yield of the communication device 10f is thus improved.

Besides, in this embodiment, a distance D3 between the second tunable component 220 and the third tunable component 320 may be substantially equal to a distance D4 between the first tunable component 120' and the second tunable component 220 (or a distance D4' between the first tunable component 120 and the second tunable component 220), but the disclosure is not limited thereto.

It should be noted that the second tunable component 220 may receive signals of different frequencies outputted from the second drive circuit 210 due to the aforementioned differences between, for example, the thin-film transistor TFT2 in the second drive circuit 210 and the thin-film transistor TFT2' in the first drive circuit 110'. For instance, the first tunable component 120' may receive a first signal (from the gate drive circuit GD coupled to a first terminal of the first drive circuit 110') from a second terminal 110'T2 of the first drive circuit 110', the second tunable component 220 may receive a second signal (from the gate drive circuit GD coupled to the second drive circuit 210) from the second drive circuit 210, and the frequency of the first signal is different from the frequency of the second signal. In some embodiments, the second tunable component 220 can receive or transmit signals in the same frequency band as the first tunable component 120. For instance, the second tunable unit 200 may be a radio frequency unit, the second tunable component 220 may be a radio frequency component and the frequency of the second tunable component 220 may also be adjusted in the range of approximately 3 MHz to 300 THz, but the disclosure is not limited thereto. Besides, in some embodiments, the second tunable component 220 may be combined with the first tunable component 120 to form a tunable unit for jointly receiving signals or jointly transmitting signals, but the disclosure is not limited thereto.

Figure 8:
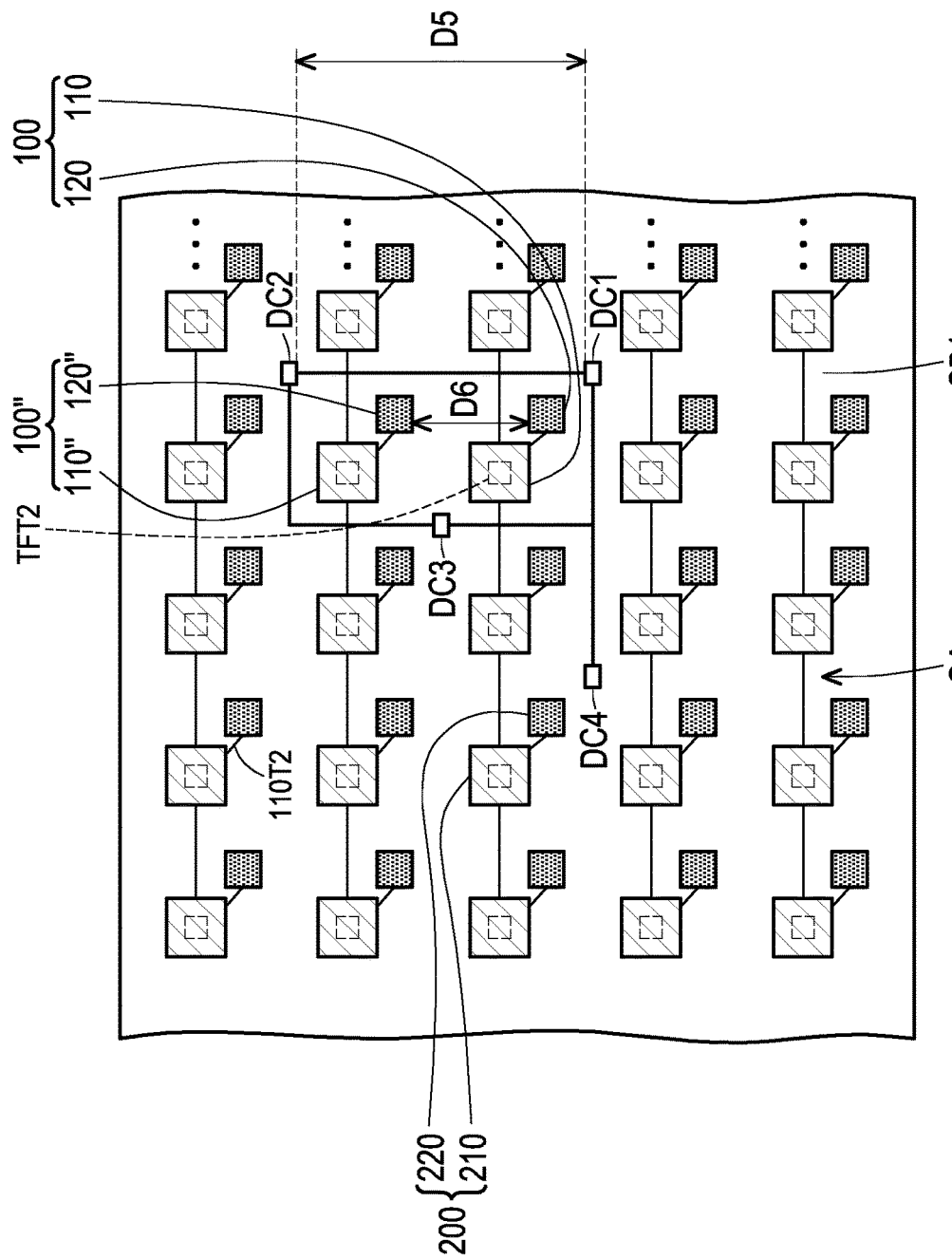
FIG. 8 is a schematic top view of a communication device according to the seventh embodiment of the disclosure.

FIG. 8 is a schematic top view of a communication device according to the seventh embodiment of the disclosure. It should be mentioned that the reference numbers and some content provided in the embodiment shown in FIG. 5 may be applied in the embodiment shown in FIG. 8, where the same or similar reference numbers serve to denote the same or similar elements, and the description of the same technical content is omitted.

With reference to FIG. 8, the main difference between a communication device 10g of this embodiment and the communication device 10d shown in FIG. 5 is that: gate drive components included in a gate drive circuit GD' in the communication device 10g are distributed in the operation area OA where the tunable units are not provided. To be specific, the communication device 10g further includes a first tunable unit 100". The first tunable unit 100" is adjacent to the first tunable unit 100 in the second direction d2 and includes a first drive circuit 110" and a first tunable component 120". The gate drive circuit GD' includes, for example, gate drive components DC1, DC2, DC3, and DC4, and the gate drive components DC1, DC2, DC3, and DC4 included in the gate drive circuit GD' may be distributed in the operation area OA where the first tunable unit 100, the first tunable unit 100", and the second tunable unit 200 are not provided. The gate drive components DC1, DC2, DC3, and DC4 may each be, for example, a resistor, a capacitor, an inductor, a transistor, a diode, a wire, or a combination thereof, but the disclosure is not limited thereto. In some embodiments, a distance D5 is provided between adjacent gate drive components (e.g., the gate drive component DC1 and the gate drive component DC2) in the second direction d2, a distance D6 is provided between the first tunable component 120 and the first tunable component 120" in the second direction d2, and the distance D5 is greater than the distance D6. It should be noted that, the gate drive circuit GD' is not limited to include four gate drive components DC1, DC2, DC3, and DC4 in this embodiment.

Figure 9:
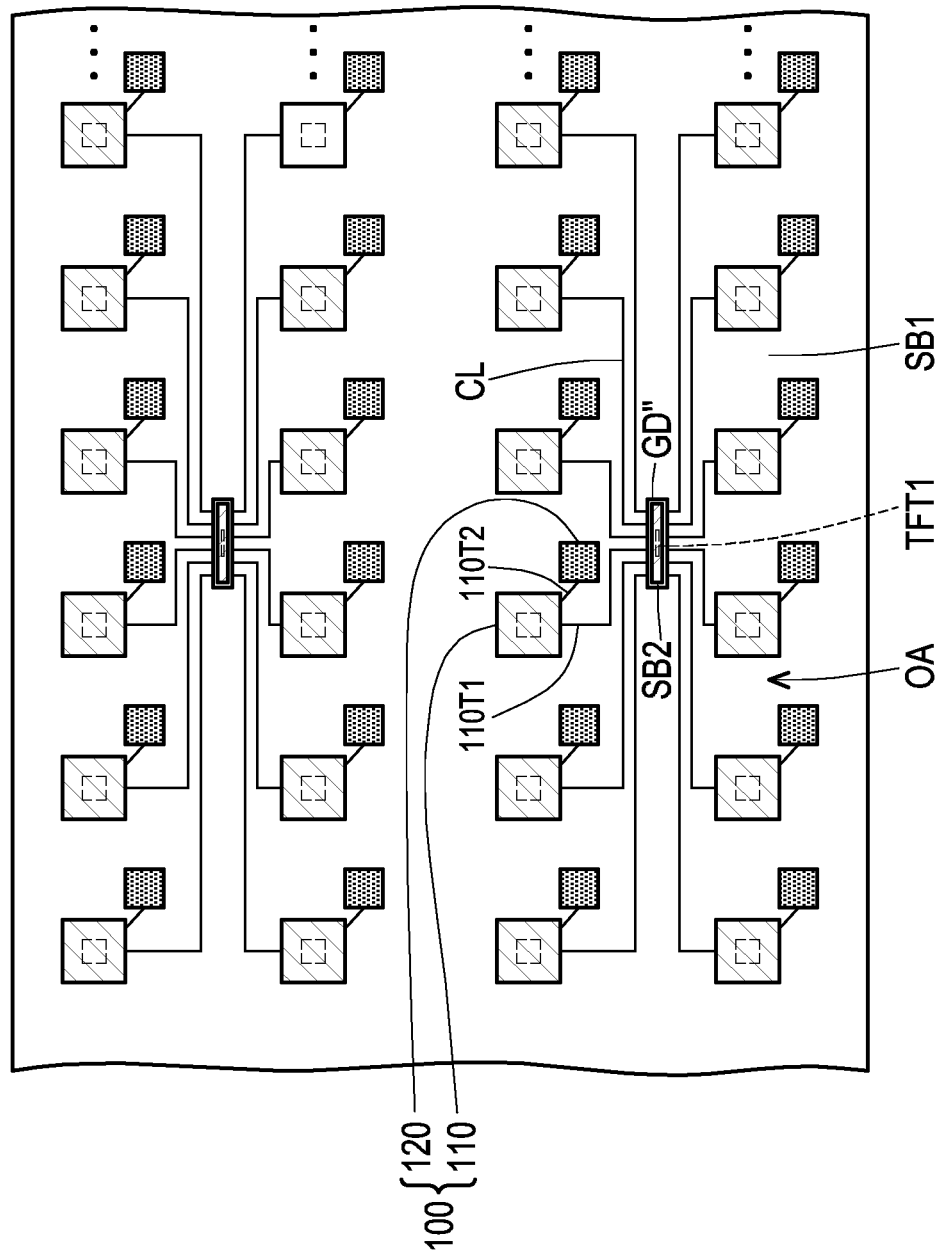
FIG. 9 is a schematic top view of a communication device according to the eighth embodiment of the disclosure.

FIG. 9 is a schematic top view of a communication device according to the eighth embodiment of the disclosure. It should be mentioned that the reference numbers and some content provided in the embodiment shown in FIG. 5 may be applied in the embodiment shown in FIG. 9, where the same or similar reference numbers serve to denote the same or similar elements, and the description of the same technical content is omitted.

With reference to FIG. 9, the main difference between a communication device 10h of this embodiment and the communication device 10d shown in FIG. 5 is that: the communication device 10h includes a substrate SB2, and the substrate SB2 is disposed on the substrate SB1. A gate drive circuit GD" included in the communication device 10h is disposed on the substrate SB2, for example, and the gate drive circuit GD" includes the thin-film transistor TFT1. In some embodiments, the gate drive circuit GD" may be disposed on the substrate SB1 in a chip on panel (COP) manner, for example. To be specific, the substrate SB2 may be a flexible substrate, a glass substrate, or other suitable substrates, and the gate drive circuit GD" may be disposed on the substrate SB1 in COP manner, for example. The thin-film transistor TFT1 in the gate drive circuit GD" may be electrically connected to each first tunable unit 100 disposed on the substrate SB1, for example, through the signal line CL.

Figure 10:
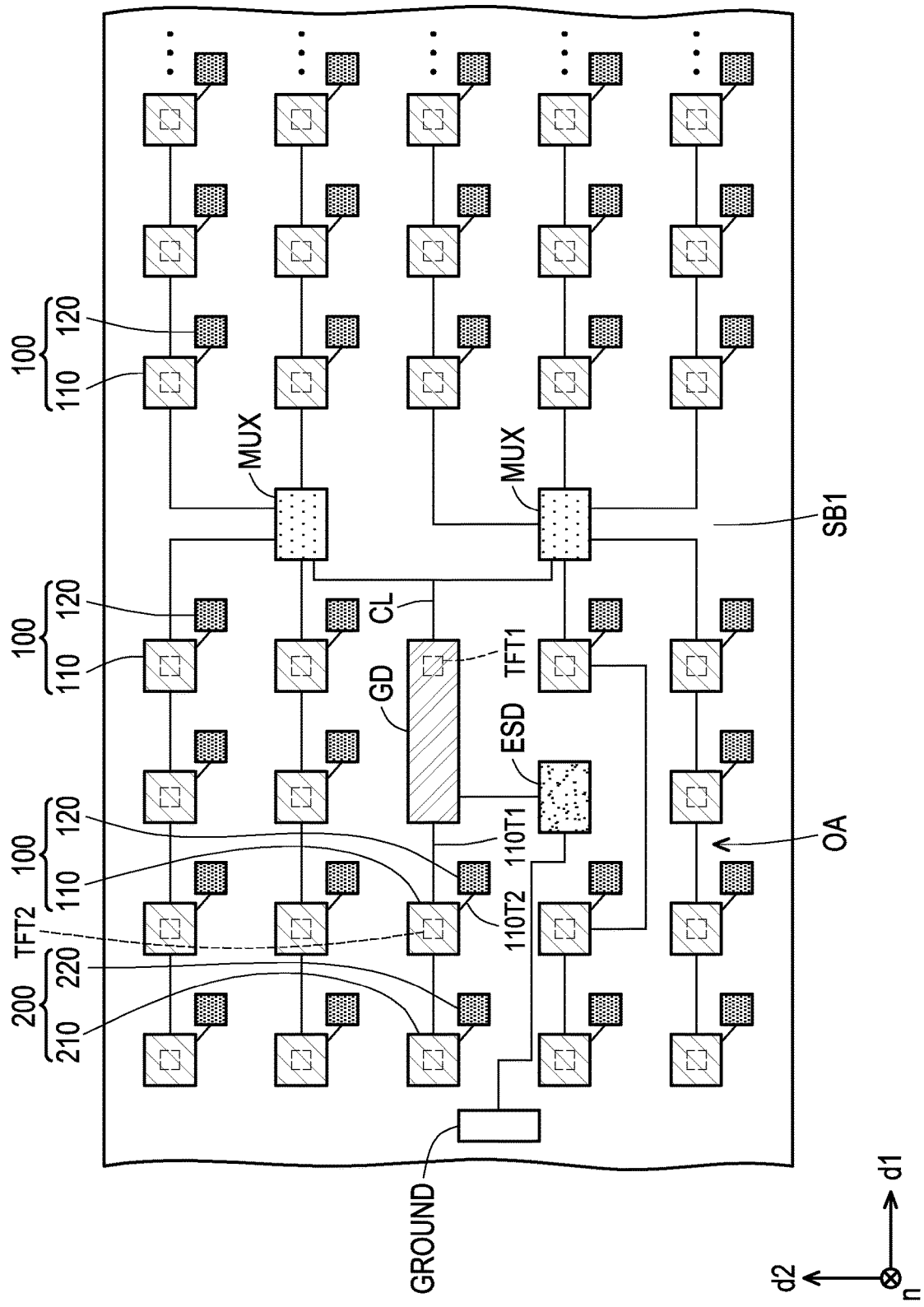
FIG. 10 is a schematic top view of a communication device according to the ninth embodiment of the disclosure.

FIG. 10 is a schematic top view of a communication device according to the ninth embodiment of the disclosure. It should be mentioned that the reference numbers and some content provided in the embodiment shown in FIG. 5 may be applied in the embodiment shown in FIG. 10, where the same or similar reference numbers serve to denote the same or similar elements, and the description of the same technical content is omitted.

With reference to FIG. 10, the main difference between a communication device 10i of this embodiment and the communication device 10d shown in FIG. 5 is that: the communication device 10i further includes a multiplexer MUX and/or an electrostatic protection circuit ESD. The multiplexer MUX is disposed in the operation area OA, for example, and is electrically connected to the first drive circuit 110 and the gate drive circuit GD. The multiplexer MUX may control the difference of the timing of sending the signal, so that the signal may be inputted to the first drive circuit 110 of the first tunable unit 100 at different time points, so that the number of gate drive circuits GD may be reduced, and the usable space of the operation area OA is increased. The electrostatic protection circuit ESD is disposed in the operation area. OA, for example, and is electrically connected to the first drive circuit 110 or the gate drive circuit GD. In some embodiments, the electrostatic protection circuit ESD is disposed in the peripheral area, for example, but it is not limited thereto. The electrostatic protection circuit ESD may be, for example, an electrostatic protection component formed by diodes, capacitors, or a combination thereof. For instance, the electrostatic protection circuit ESD may include a transistor formed by a plurality of diodes, but the disclosure is not limited thereto. The electrostatic protection circuit ESD may provide a signal transmission path with relatively low impedance to provide the effect of electrostatic protection. Besides, in this embodiment, the electrostatic protection circuit ESD may be electrically connected to a ground electrode GROUND to increase the effect of electrostatic protection, but the disclosure is not limited thereto. It is worth noting that the number of multiplexers MUX, the connection relationship between the multiplexers MUX and the rest of the members, the number of electrostatic protection circuits ESD, and the connection relationship between the electrostatic protection circuits ESD and the rest of the members shown in this embodiment are examples only, and the disclosure is not limited thereto. Further, although the present embodiment shows that the communication device 10*i* includes both the multiplexer MUX and the electrostatic protection circuit ESD, the disclosure is not limited thereto. That is, the communication device 10*i* may include only one of the multiplexer MUX and the electrostatic protection circuit ESD.

Figure 11:
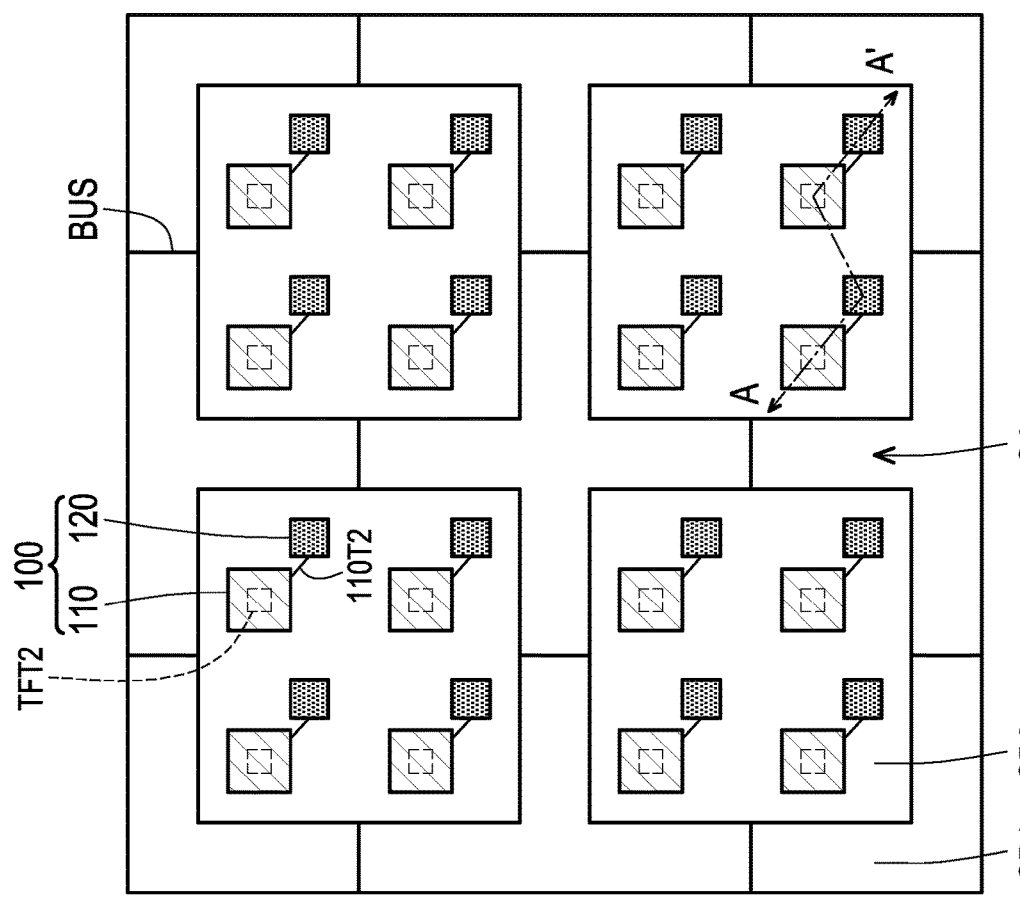
FIG. 11 is a schematic top view of a communication device according to the tenth embodiment of the disclosure.
Figure 12A:
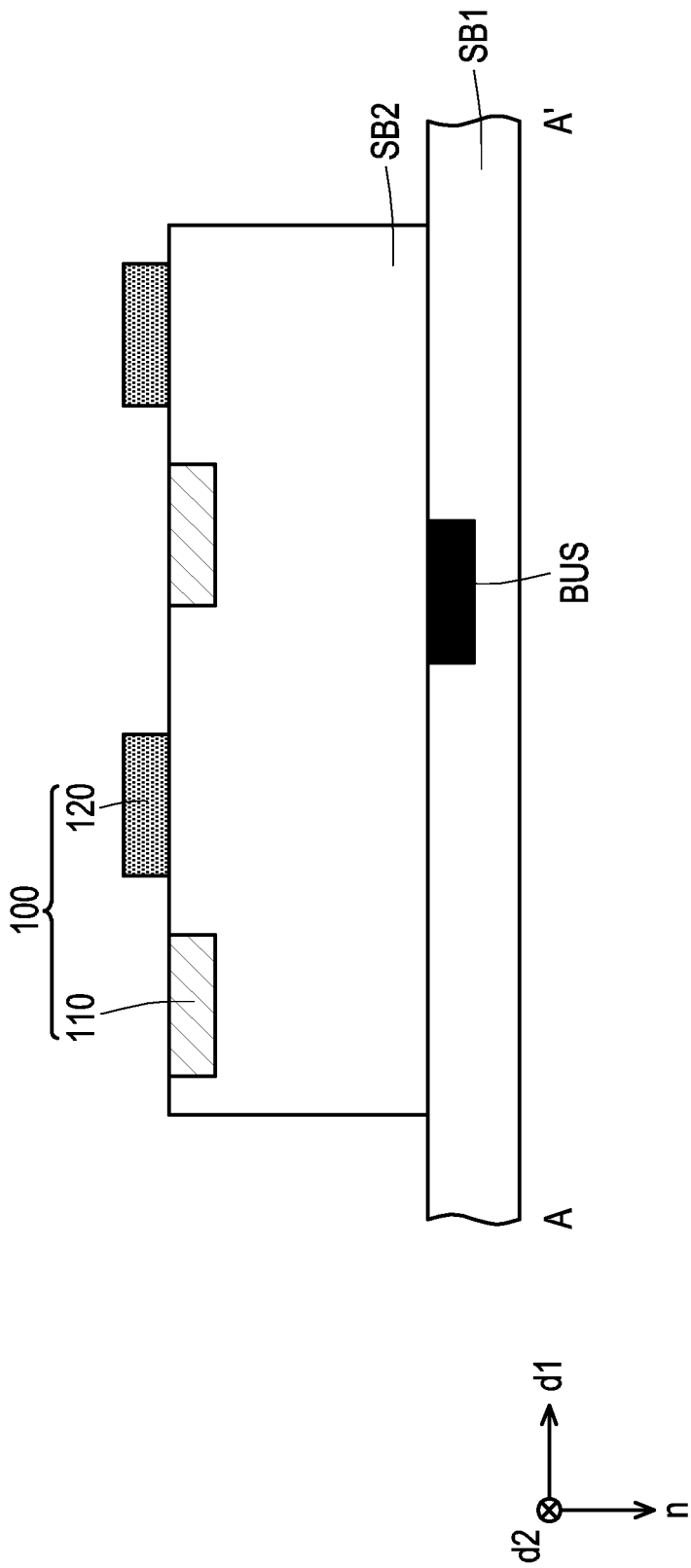
FIG. 12A is a schematic cross-sectional view taken along the section line A-A' of FIG. 11 according to an embodiment.

FIG. 11 is a schematic top view of a communication device according to the tenth embodiment of the disclosure, and FIG. 12A is a schematic cross-sectional view taken along the section line A-A' of FIG. 11 according to an embodiment. It should be mentioned that the reference numbers and some content provided in the embodiment shown in FIG. 1 may be applied in the embodiment shown in FIG. 11, where the same or similar reference numbers serve to denote the same or similar elements, and the description of the same technical content is omitted.

With reference to FIG. 11, the main difference between a communication device 10*j* of this embodiment and the communication device 10*a* shown in FIG. 1 is that: the communication device 10*j* further includes the substrate SB2 and a busbar BUS. The first tunable unit 100 included in the communication device 10*j* is disposed on the substrate SB2, for example. In some embodiments, the substrate SB2 may, for example, include an insulating and thermally-conductive material. For instance, the substrate SB2 may be, for example, a copper-clad ceramic substrate, but the disclosure is not limited thereto. The gate drive circuit GD included in the communication device 10*j* is disposed on the substrate SB1, for example, but the disclosure is not limited thereto. In other embodiments, the gate drive circuit GD included in the communication device 10*j* may also be disposed on the substrate SB1. Besides, the busbar BUS is disposed on the substrate SB1, and the adjacent substrates SB2 may be electrically connected to each other through the busbar BUS, so that the signal sent by the gate drive circuit GD may be transmitted between the adjacent substrates SB2.

Figure 12B:
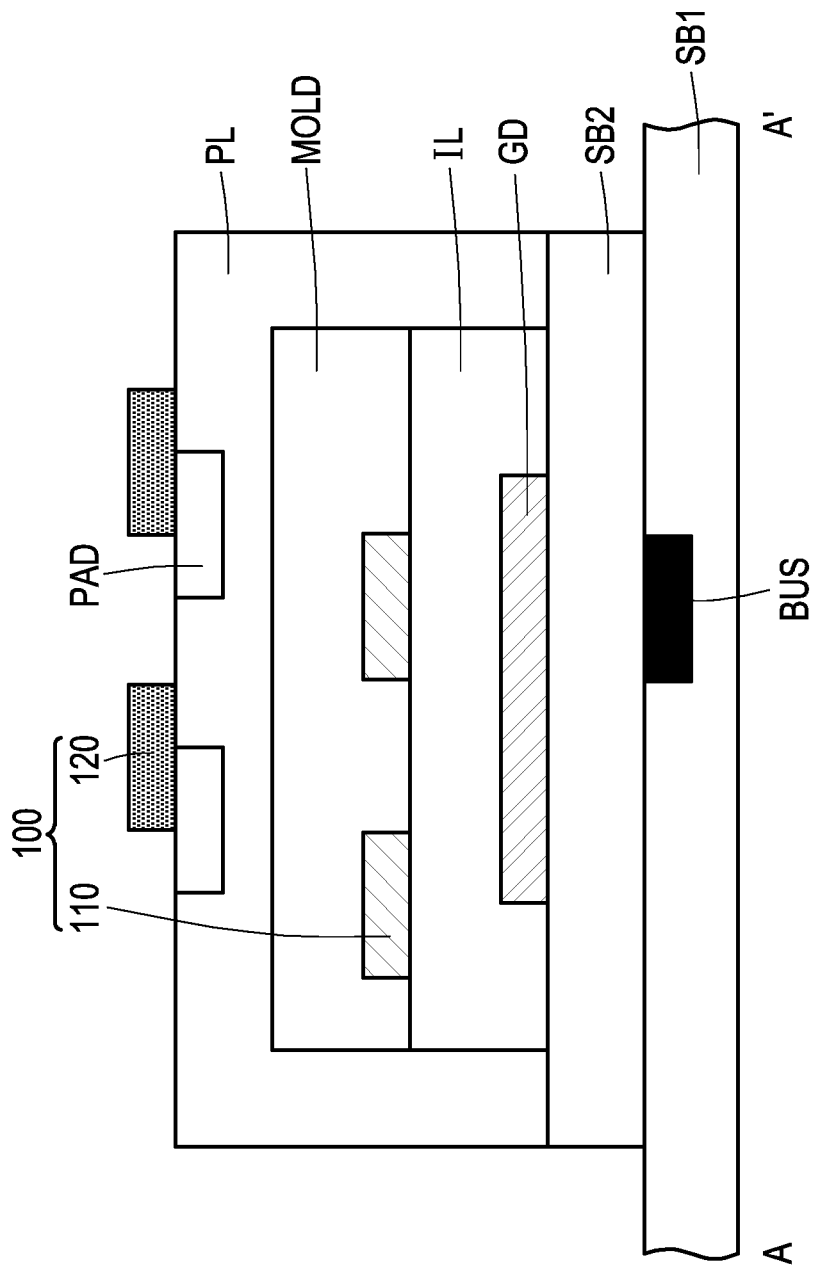
FIG. 12B is a schematic cross-sectional view taken along the section line A-A' of FIG. 11 according to another embodiment.

FIG. 12A is a schematic cross-sectional view taken along the section line A-A' of FIG. 11 according to an embodiment, and FIG. 12B is a schematic cross-sectional view taken along the section line A-A' of FIG. 11 according to another embodiment. It should be mentioned that the reference numbers and some content provided in the embodiment shown in FIG. 12A may be applied in the embodiment shown in FIG. 12B, where the same or similar reference numbers serve to denote the same or similar elements, and the description of the same technical content is omitted.

With reference to FIG. 12B, in some embodiments, the communication device 10*j* may further include an insulating layer IL, a film-sealing layer MOLD, a packaging layer PL, and a contact pad PAD, and the gate drive circuit 200 is disposed on the substrate SB2. To be specific, the gate drive circuit GD and the insulating layer IL are disposed on the substrate SB2, for example, and the insulating layer IL covers the gate drive circuit GD, for example. The first drive circuit 110 of the first tunable unit 100 and the film-sealing layer MOLD are disposed on the insulating layer IL, for example, and the film-sealing layer MOLD covers, for example, the first drive circuit 110. The packaging layer PL is provided on the substrate SB2, for example, and covers the film-sealing layer MOLD. The contact pad PAD is disposed on the packaging layer PL, for example, and the first tunable component 120 of the first tunable unit 100 may be electrically connected to the first drive circuit 110 through the contact pad PAD. The insulating layer IL, the film-sealing layer MOLD, and the packaging layer PL may include, for example, insulating and thermally-conductive materials, which are not limited in the disclosure.

Figure 13:
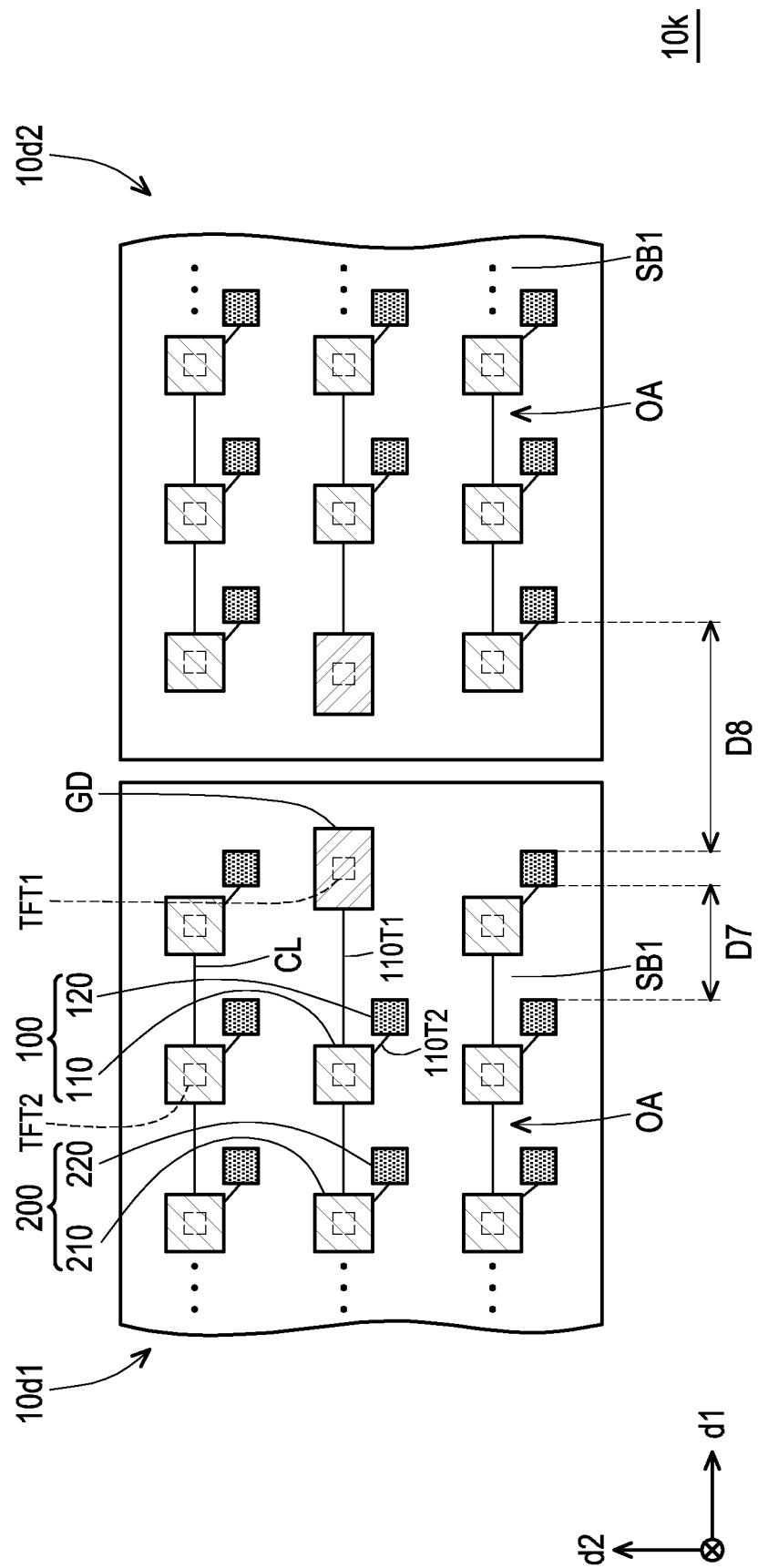
FIG. 13 is a schematic top view of a communication device according to the eleventh embodiment of the disclosure.

FIG. 13 is a schematic top view of a communication device according to the eleventh embodiment of the disclosure. It should be mentioned that the reference numbers and some content provided in the embodiment shown in FIG. 5 may be applied in the embodiment shown in FIG. 13, where the same or similar reference numbers serve to denote the same or similar elements, and the description of the same technical content is omitted.

With reference to FIG. 13, the main difference between a communication device 10*k* of this embodiment and the communication device 10*d* shown in FIG. 5 is that: the communication device 10*k* is a spliced communication device. To be specific, two communication devices 10*d* shown in FIG. 5 may be spliced to form the communication device 10*k*, but the present disclosure is not limited thereto. That is, all the communication devices mentioned in the foregoing embodiments may be used for splicing to form a new communication device. In this embodiment, a communication device 10*d*1 is spliced with a communication device 10*d*2 to form the communication device 10*k*. A distance D7 between the adjacent first tunable components 120 in the first direction d1 in the communication device 10*d*1 or in the communication device 10*d*2 is less than, for example, a distance D8 between the first tunable component 120 in the communication device 10*d*1 and the first tunable component 120 in the communication device 10*d*2 in the first direction d1. Further, the distance D7 and the distance D8 satisfy the following relation: D7<D8<10*D7. In some embodiments, the communication device 10*k* may further include a control unit (not shown) and a plurality of signal transmission lines (not shown). The signal transmission lines may be used to, for example, electrically connect the control unit with the communication device 10*d*1 and the communication device 10*d*2, but the disclosure is not limited thereto.

According to the above, in the embodiments of the disclosure, a novel communication device is provided, in which the gate drive circuit is directly disposed on the substrate of the communication device. In this way, the number of gate drive circuits used may be reduced, and a narrow frame design may be achieved.

Finally, it is worth noting that the foregoing embodiments are merely described to illustrate the technical means of the disclosure and should not be construed as limitations of the disclosure. Even though the foregoing embodiments are referenced to provide detailed description of the disclosure, people having ordinary skill in the art should understand that various modifications and variations can be made to the technical means in the disclosed embodiments, or equivalent replacements may be made for part or all of the technical features; nevertheless, it is intended that the modifications, variations, and replacements shall not make the nature of the technical means to depart from the scope of the technical means of the embodiments of the disclosure. As long as the features of the embodiments do not violate the spirit of the disclosure or conflict each other, they may be mixed and matched as desired.

What is claimed is:

1. A communication device, comprising: a substrate; a gate drive circuit disposed on the substrate, wherein the gate drive circuit comprises a first thin-film transistor, and the gate drive circuit is configured to output a gate drive signal; and a first tunable unit disposed on the substrate and electrically connected to the gate drive circuit, comprising: a first drive circuit comprising a first terminal and a second terminal, wherein the first terminal is configured to receive the gate drive signal; and a first tunable component electrically connected to the second terminal, wherein the substrate has an operation area and a peripheral area, and the first tunable unit and the gate drive circuit are disposed in the operation area, further comprising a second tunable unit and a third tunable unit, wherein the second tunable unit and the third tunable unit are electrically connected to the gate drive circuit, the second tunable unit is disposed between the first tunable 25 unit and the third tunable unit, the first tunable unit is closer to the gate drive circuit than the second tunable unit, the second tunable unit comprises a second tunable component, and the third tunable unit comprises a third tunable component, wherein a distance between the second tunable component and the third tunable component is less than a distance between the first tunable component and the second tunable component.

2. The communication device according to claim 1, wherein the first drive circuit further comprises a second thin-film transistor, a channel of the first thin-film transistor comprises a first width and a first length, a channel of the second thin-film transistor comprises a second width and a second length, and a ratio of the second width to the second length is less than a ratio of the first width to the first length.

3. The communication device according to claim 2, wherein the first thin-film transistor and the second thin-film transistor comprise a U-type thin-film transistor, an I-type thin-film transistor, or a combination thereof.

4. The communication device according to claim 1, wherein the substrate has an operation area and a peripheral area, the first tunable unit is disposed in the operation area, and the gate drive circuit is disposed in the peripheral area.

5. The communication device according to claim 1, further comprising a second tunable unit, wherein the first drive circuit further comprises a second thin-film transistor, the first tunable unit is closer to the gate drive circuit than the second tunable unit, the first tunable unit and the second tunable unit are electrically connected to the gate drive circuit, the second tunable unit comprises a second drive circuit, and the second drive circuit further comprises a third thin-film transistor, wherein a channel of the second thin-film transistor comprises a second width and a second length, a channel of the third thin-film transistor comprises a third width and a third length, and a ratio of the second width to the second length is different from a ratio of the third width to the third length.

6. The communication device according to claim 5, wherein the ratio of the second width to the second length is greater than the ratio of the third width to the third length.

7. The communication device according to claim 1, further comprising a second tunable unit, wherein the first drive circuit further comprises a second thin-film transistor, the first tunable unit is closer to the gate drive circuit than the second tunable unit, the first tunable unit and the second tunable unit are electrically connected to the gate drive circuit, the second tunable unit comprises a second drive circuit, and the second drive circuit further comprises a third thin-film transistor, wherein a semiconductor layer of the second thin-film transistor and a semiconductor layer of the third thin-film transistor have different materials or different lattice structures.

8. The communication device according to claim 1, further comprising a second tunable unit comprising a second drive circuit and a second tunable component, wherein the first tunable component is configured to receive a first signal from the first drive circuit, and the second tunable component is configured to receive a second signal from the second drive circuit, wherein a frequency of the first signal is different from a frequency of the second signal.

9. The communication device according to claim 1, further comprising a second tunable unit adjacent to the first tunable unit in a first direction and comprising a second tunable component, wherein the gate drive circuit comprises a plurality of gate drive components, adjacent gate drive components have a third distance in the first direction, a fourth distance is provided between the first tunable component and the second tunable component in the first direction, and the third distance is greater than the fourth distance.

10. The communication device according to claim 1, wherein the first drive circuit further comprises a second thin-film transistor, a semiconductor layer of the first thin-film transistor and a semiconductor layer of the second thin-film transistor have different materials or different lattice structures.

11. The communication device according to claim 1, wherein the first drive circuit further comprises a second thin-film transistor and a third thin-film transistor, and a semiconductor layer of the second thin-film transistor and a semiconductor layer of the third thin-film transistor have different materials.

12. The communication device according to claim 1, wherein the gate drive circuit further comprises a third thin-film transistor, and a semiconductor layer of the first thin-film transistor and a semiconductor layer of the third thin-film transistor have different materials.

13. The communication device according to claim 1, further comprising a multiplexer, wherein the multiplexer is disposed on the substrate and is electrically connected to the first drive circuit and the gate drive circuit.

14. The communication device according to claim 1, further comprising an electrostatic protection circuit, wherein the electrostatic protection circuit is disposed on the substrate and is electrically connected to the first drive circuit or the gate drive circuit.

15. The communication device according to claim 1, further comprising a plurality of second tunable units, wherein the second tunable units and the first tunable unit are arranged into a plurality of rows, wherein the relationship between the sums of the numbers of the second tunable units and the first tunable unit in the rows satisfies the following relation: $|(N_a - N_{a+1})| < 10\%$, $N_a$ is the sum of the numbers of the second tunable units and the first tunable unit in row a, $N_{a+1}$ is the sum of the numbers of the second tunable units and the first tunable unit in row a+1, and a is a natural number.

16. A communication device, comprising: a first substrate; a second substrate disposed on the first substrate; a gate drive circuit disposed on the second substrate, wherein the gate drive circuit comprises a first thin-film transistor; and a first tunable unit disposed on the first substrate and electrically connected to the gate drive circuit, comprising: a first drive circuit; and a first tunable component electrically connected to the first drive circuit, wherein a second tunable unit and a third tunable unit, wherein the second tunable unit and the third tunable unit are electrically connected to the gate drive circuit, the second tunable unit is disposed between the first tunable 25 unit and the third tunable unit, the first tunable unit is closer to the gate drive circuit than the second tunable unit, the second tunable unit comprises a second tunable component, and the third tunable unit comprises a third tunable component, wherein a distance between the second tunable component and the third tunable component is less than a distance between the first tunable component and the second tunable component.

17. A communication device, comprising: a first substrate; a second substrate disposed on the first substrate; a gate drive circuit disposed on the first substrate or the second substrate, wherein the gate drive circuit comprises a first thin-film transistor, and the gate drive circuit is configured to output a gate drive signal; and 25 a first tunable unit disposed on the second substrate and electrically connected to the gate drive circuit, comprising: a first drive circuit comprising a first terminal and a second terminal, wherein the first terminal is configured to receive the gate drive signal; and a first tunable component electrically connected to the second terminal, wherein a second tunable unit and a third tunable unit, wherein the second tunable unit and the third tunable unit are electrically connected to the gate drive circuit, the second tunable unit is disposed between the first tunable 25 unit and the third tunable unit, the first tunable unit is closer to the gate drive circuit than the second tunable unit, the second tunable unit comprises a second tunable component, and the third tunable unit comprises a third tunable component, wherein a distance between the second tunable component and the third tunable component is less than a distance between the first tunable component and the second tunable component.

18. The communication device according to claim 17, comprising a plurality of second substrates, wherein two adjacent of the plurality of second substrates are electrically connected to each other through a busbar.

\* \* \* \* \*